United States Patent
Williams et al.

(10) Patent No.: US 11,756,433 B2
(45) Date of Patent: Sep. 12, 2023

(54) CONCURRENT, MULTI-SENSOR, MULTI-INERTIAL NAVIGATION SYSTEM FLIGHT EMULATION

(71) Applicant: Raytheon Company, Waltham, MA (US)

(72) Inventors: Brad S. Williams, McKinney, TX (US); Thomas M. Taylor, Oklahoma City, OK (US)

(73) Assignee: Raytheon Company, Waltham, MA (US)

(*) Notice: Subject to any disclaimer, the term of this patent is extended or adjusted under 35 U.S.C. 154(b) by 177 days.

(21) Appl. No.: 17/235,564

(22) Filed: Apr. 20, 2021

(65) Prior Publication Data

US 2022/0335836 A1   Oct. 20, 2022

(51) Int. Cl.
*G08G 5/00* (2006.01)
*B64D 43/02* (2006.01)
*G01C 21/20* (2006.01)
*G01S 19/45* (2010.01)
*G05D 1/10* (2006.01)

(52) U.S. Cl.
CPC .............. *G08G 5/003* (2013.01); *B64D 43/02* (2013.01); *G01C 21/20* (2013.01); *G01S 19/45* (2013.01); *G05D 1/101* (2013.01)

(58) Field of Classification Search
CPC .......... G05D 1/101; G01C 21/20; G08G 5/003
See application file for complete search history.

(56) References Cited

U.S. PATENT DOCUMENTS 6,735,523 B1 * 5/2004 Lin .................. G01S 19/23
701/472
11,168,986 B2 * 11/2021 Allen .................. G01S 19/33

OTHER PUBLICATIONS

"IMU Modeling and Simulation", Retrieved Online. URL <https://castnav.com/inertial-capabilities/>, 6 pgs.

* cited by examiner

*Primary Examiner* — Nicholas Kiswanto
*Assistant Examiner* — Christopher A Buksa
(74) *Attorney, Agent, or Firm* — Schwegman Lundberg & Woessner, P.A.

(57) ABSTRACT

A flight emulation system receives global positioning system (GPS) data into one or more EGIs (embedded GPS/inertial navigation system (INS)) or GPS receivers from a GPS emulator. The GPS data are based on a pre-defined flight trajectory plan of an aircraft. The system calculates real-time positional, orientational, and inertial emulation data using outputs of the EGIs or GPS receivers and platform-specific, flight dynamics data, and then transmits the real-time positional, orientational, and inertial emulation data to one or more subsystems associated with the aircraft for use by operations of the one or more subsystems.

19 Claims, 7 Drawing Sheets

CONCURRENT, MULTI-SENSOR, MULTI-INERTIAL NAVIGATION SYSTEM FLIGHT EMULATION

TECHNICAL FIELD

Embodiments described herein generally relate to concurrent, multi-sensor, multi-inertial navigation system flight emulation.

BACKGROUND

Emulating flight to embedded global positioning system (GPS)/inertial navigation systems (INS) (EGIs) for lab environments (including stationary aircraft) is often problematic as EGIs quickly become aware of a disparity between their GPS and INS inputs. When this occurs, the EGIs will output a stationary or uncontrolled drift to its sensor.

Current approaches to emulate INS flight in stationary environments fully replace the EGI with a software emulator. For example, one current approach fully replaces the EGI with a computer running a flight simulator that outputs messages to a bus controller. This approach only emulates a single EGI, requires complex flight simulator planning, and includes a not insignificant cost.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings.

DETAILED DESCRIPTION

In an embodiment relating to embedded global positioning system (GPS)/inertial navigation systems (INS) (EGIs), emulation flight planning is simplified, EGI hardware test coverage is maximized, inputs to a multi-sensor and multi-EGI system are time and position synchronized, and EGI and sensor integration capabilities in stationary locations such as a lab or a grounded aircraft are improved. In addition to these enhanced capabilities, an embodiment is far less expensive than existing emulators.

As in known in the art, EGIs feed data to sensors that are associated with aircraft. These data inform the sensors of the position and orientation of the aircraft. A system embodiment emulates and tests EGIs and their outputs. One type of sensor is a surveillance sensor, such as a video sensor. A problem is EGIs however is that the EGIs give preference to the inertial side.

An advantage of the disclosed embodiments is that they are very scalable. That is, the system can support multiple EGIs, whereas prior systems are customized to a particular EGI. Another advantage is that the embodiments provide a simple way to generate flight paths that are desired to be emulated. Prior systems require flight simulator packages, and these flight simulator packages are aligned with a particular aircraft. Another advantage is that the EGIs of the present disclosure are positioned within a test loop. Prior emulators in contrast completely replace the EGIs. In short, an embodiment can include multiple concurrent EGIs, can accept GPS emulated data rather than flight navigation orientation data (which further provides scalability), and can test a system either with or without the EGI in the loop.

Yet another advantage is that the disclosed embodiments can be easily ported over to a different type of aircraft via the use of adaptation parameters. This is another reason that a flight simulator is not needed. Rather, a GPS simulator is used instead of a flight simulator.

Embodiments also permit the splitting of data. This splitting requires more than simply splitting the data feed. The format could be different for each EGI, and the splitting requires coordination and timing so that the navigational processing core (NPC) can feed multiple sensors with positional and orientation data that are synchronized in time and position. This permits positional and orientation data in different formats to be transmitted simultaneously. This then basically results in a system of systems. Also, since the embodiments are embedded, no hardware other than that which is already present is required.

The NPC, as explained in more detail below in connection with the figures, receives GPS messages from a GPS or an EGI. These positional and orientation data are sent to the sensors that are associated with an aircraft. Configuration files that are associated with the NPC are loaded. These configuration files inform how to decode the GPS data it receives (based on such things as the input device, the platform, etc.). The configuration files include platform specific dynamics such as rate of turn at what altitude for this particular plane's pitch, and position and climb rates to calculate orientation parameters. Messages are then generated for the sensors. The messages inform the sensor of the of the location and orientation of platform (aircraft) so that the sensor can adjust its gimble to keep pointing at a target (such as a camera pointing at a building).

In one embodiment, the NPC executes on a laptop. In this embodiment, the NPC is not embedded, and can be associated with a single sensor, such as a radar. In another embodiment, the NPC executes on a tactical system, such that it is considered to be in the loop (that is, the hardware that is used in the actual product is used in the lab or a test loop). In yet another embodiment, which also is embedded in a loop, there can be multiple EGIs and multiple sensors. That is, multiple and separate units are being emulated.

More specifically, an embodiment includes two functional/hardware elements—a GPS emulator and a navigational processing core (NPC). The GPS emulator is a physical unit that transmits GPS information based on a predefined flight trajectory plan to an EGI. In another embodiment, the GPS information from the GPS emulator can be fed into a splitter to feed multiple EGIs with synchronized time and positional data. The NPC intercepts positional reports generated by the EGI(s) and that are intended for the aircraft sensor, modifies the contents of the reports to incorporate pre-defined flight dynamics and GPS positional information, and transmits the modified report/message to the intended sensor. In an embodiment, the NPC is a software module that can be loaded onto the equipment being tested, or it can be loaded onto its own dedicated computer with a media converter that can communicate with the EGI(s). The desired navigational messages and platform specific flight dynamics are configurations loaded into the NPC. By changing the configuration file and media converter, an embodiment can readily be adapted to a wide variety of platforms and physical EGI interconnects. An embodiment is also scalable to a large number of concurrent EGIs and sensors, and it ensures synchronized navigational data in a multi-sensor system.

In short, modifying EGI messages, rather than replacing the EGI in its entirety, is a new approach that greatly enhances integration capability and test coverage. Combining a GPS emulator with configurable flight dynamics yields a flexible solution that can be adapted to a variety of platforms and any number of EGIs concurrently.

Figure 1:
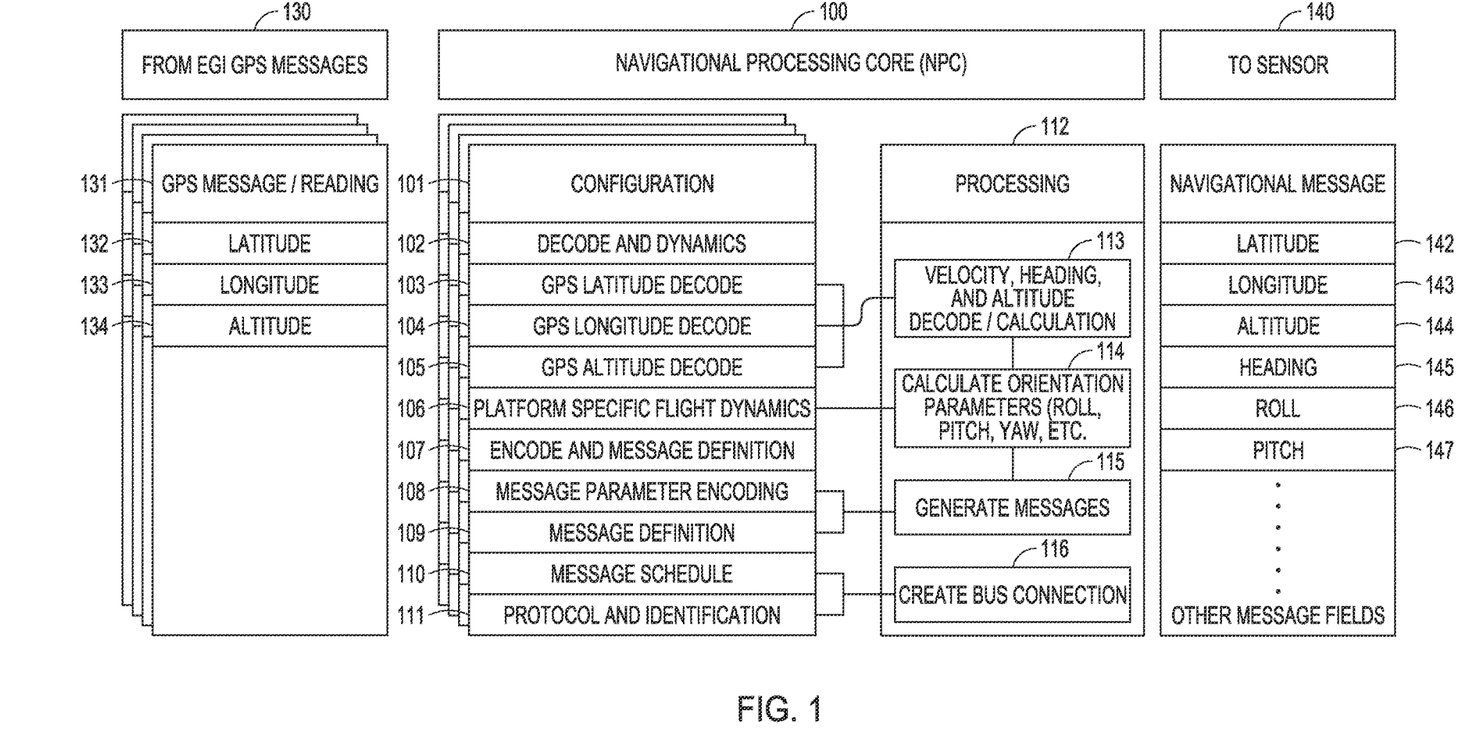
FIG. 1 is a block diagram of an example embodiment of a navigational processing core (NPC).

FIG. 1 is a block diagram of an example embodiment of a navigational processing core (NPC). As illustrated in FIG. 1, the NPC 100 receives its input from EGI/GPS messages 130 and transmits its output to sensors 140. The EGI/GPS messages 131 include data such as latitude 132, longitude 133, and altitude 134. The NPC 100 includes configuration files 101. These configuration files contain decode data and flight dynamics data 102. The decode data include GPS latitude data 103, GPS longitude data 104, and GPS altitude data 105 (from the GPS/EGI messages). The configuration file 101 further includes platform (aircraft) specific flight dynamics 106, encode and message definitions 107, message parameter encoding 108, message definitions 109, message schedules 110, and protocols and identifications 111.

The processing 112 of the NPC 100 receives the data from the configuration file 101, and processes it as illustrated in FIG. 1. Specifically, at 113, the NPC 100 uses the GPS latitude data 103, GPS longitude data 104, GPS altitude data 105 to determine the velocity, heading, and altitude correction for the stationary aircraft or other lab environment. At 114, the NPC 112 uses the platform specific flight dynamics 106 to determine the orientation adjustment (roll, pitch, yaw, etc.). At 115, the NPC 100 uses the message parameter encoding 108 and message definitions 109 to generate the messages that will be transmitted to the sensors 140. Similarly, at 116, the NPC 100 uses the message schedules 110 and protocols and identifications 111 to create the bus connection for the sensor 140.

The sensor 140 receives this transmission from the NPC 100, stores in its navigational message 141 the data such as the latitude 142, the longitude 143, the altitude 144, heading 145, roll 146, and pitch 147, and provides this information to a particular sensor so that the sensor is aware of the position and orientation of the aircraft.

Figure 2:
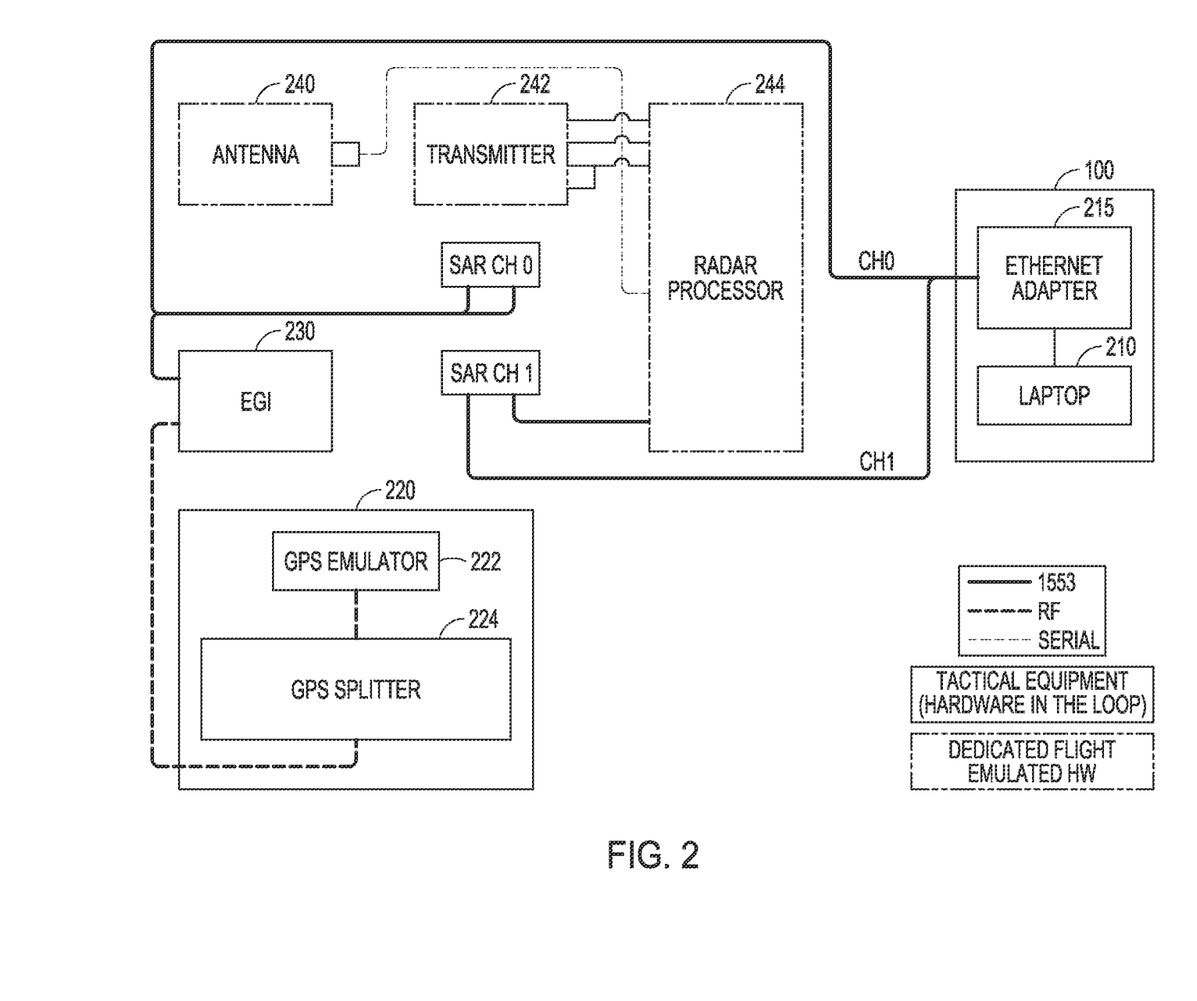
FIG. 2 is a block diagram of an example embodiment of a single system, standalone navigational processing core (NPC).

FIG. 2 is a block diagram of an example embodiment of a single system, standalone navigational processing core (NPC) 100. The NPC 100 is loaded onto a laptop 210, and communicates with the other devices via a bus adapter, which in FIG. 2 is an ethernet adapter 215. A GPS emulation unit 220 includes a GPS emulator 222 and a GPS splitter 224. The output from the GPS emulator 222 is divided up by the GPS splitter 224, and the output is transmitted to EGI 230. The data from the GPS emulation unit 220 and EGI 230 are transmitted to the NPC 100, and the processing results of the NPC 100 are transmitted to a sensor via an antenna 240, a transmitter 242, and an integrated radar transmitter 244.

The two channels in FIG. 2 illustrate the scalability of an embodiment, and further channels could be added for even more scalability.

Figure 3:
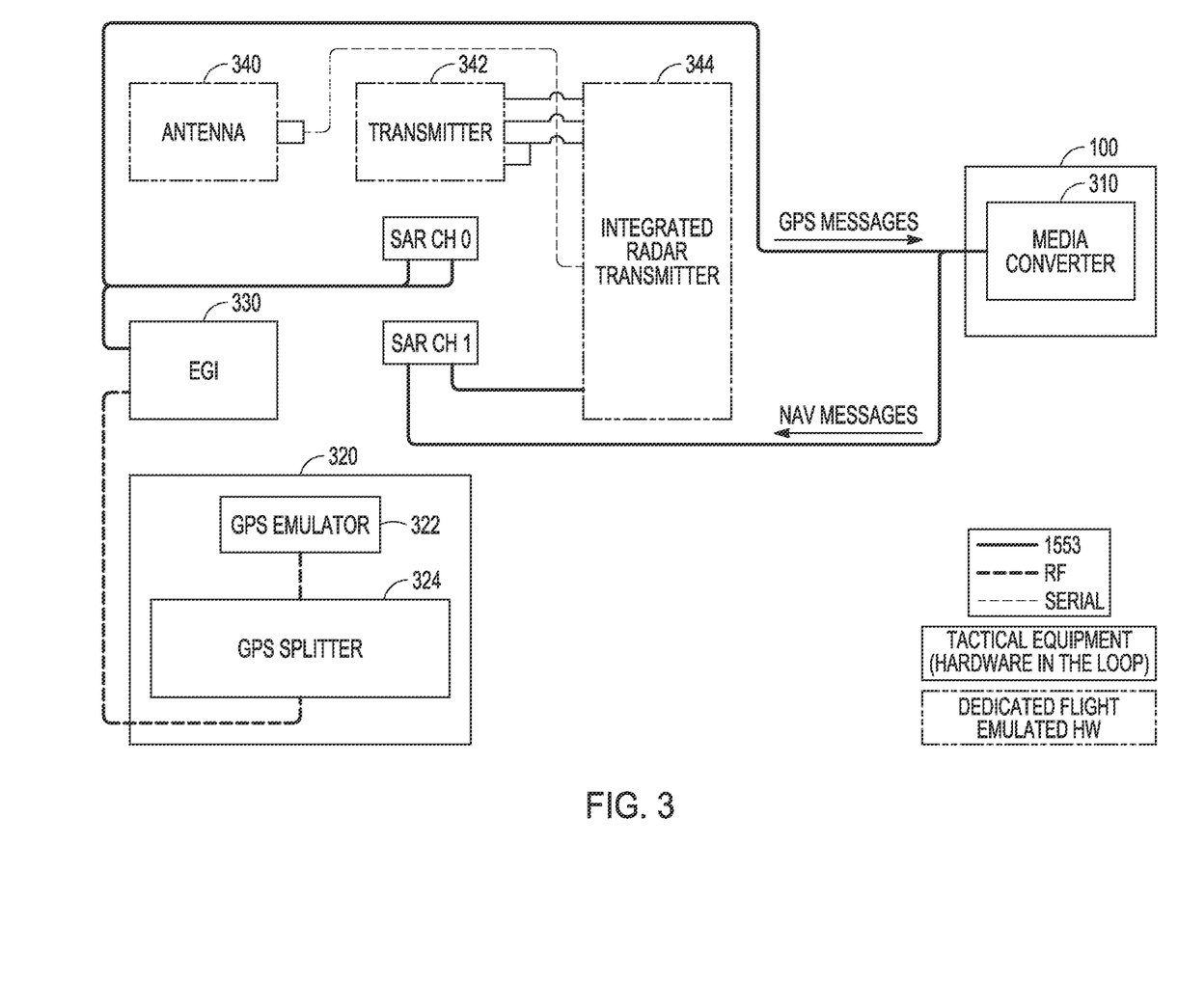
FIG. 3 is a block diagram of an example embodiment of a single system, embedded navigational processing core (NPC).

FIG. 3 is a block diagram of an example embodiment of a single system, embedded navigational processing core (NPC) 100. The NPC 100 is loaded onto a media converter 310. In an embodiment, the media converter 310 is currently present in an existing system, which then requires minimal hardware for implementation. The media converter converts the GPS messages. The single system with the embedded NPC 100 further includes a GPS emulation unit 320, which includes a GPS emulator 322 and a GPS splitter 324. The output from the GPS emulator 322 is divided up by the GPS splitter 324, and the output is transmitted to EGI 330. The data from the GPS emulation unit 320 and EGI 330 are transmitted to the NPC 100 in the media converter 310. The NPC processes these data as illustrated in FIGS. 1 and 6, and the NPC 100 then transmits a navigation message to the lab environment via an antenna 340, a transmitter 342, and an integrated radar transmitter 344. Like in FIG. 2, the two channels in FIG. 3 illustrate the scalability of an embodiment, and further channels could be added for even more scalability.

Figure 4:
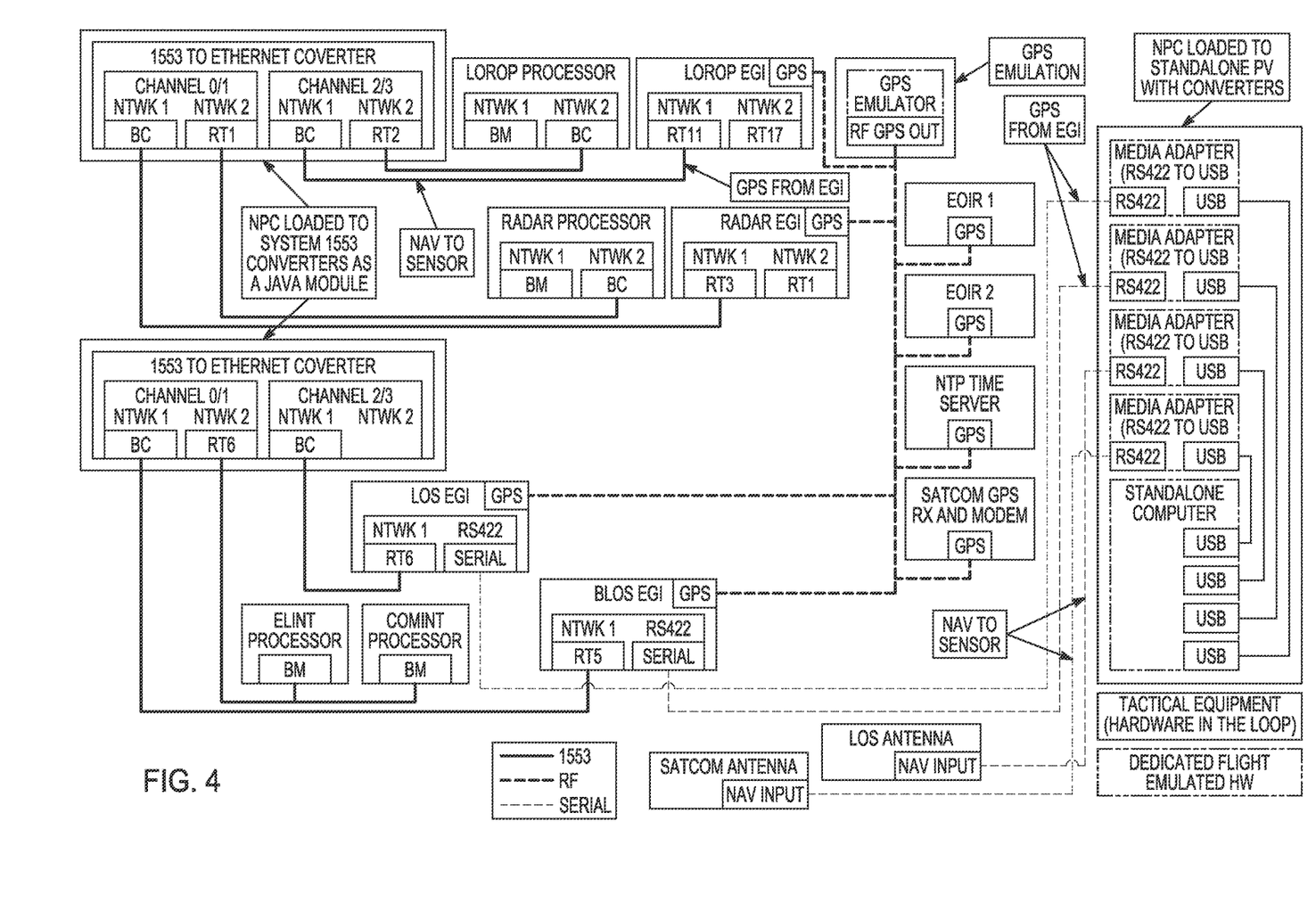
FIG. 4 is a block diagram of an example embodiment of a multi-system, embedded navigational processing core (NPC).

FIG. 4 is a block diagram of an example embodiment of a multi-system, embedded navigational processing core (NPC) 100. The embodiment of FIG. 4 concurrently emulates GPS and navigational messages from multiple (e.g., four) EGIs to a large number of subsystems. The lab/aircraft sensors receive emulated navigational messages via the proper protocol (e.g., tactical system 1553 protocol) from the NPC emulating several EGIs concurrently. The EGIs are in the loop providing GPS messages to the NPC. Then, the NPC uses the GPS (1553 protocol) messages to calculate and generate Navigational (1553 protocol) messages. The NPC is running as an embedded process in a tactical system (such as tactical system 1553). In an embodiment, two communication antennas (Line of Sight and SATCOM) receive emulated navigational messages via RS422 protocol from the NPC emulating two or more EGIs concurrently. The EGIs are in the loop providing GPS messages to the NPC. The NPC uses the GPS RS422 messages from the EGIs to calculate and generate Navigational RS422 messages. The NPS is running as a process on a standalone laptop and media converter bundle that is not part of the tactical hardware. Additional subsystems receive direct radio frequency (rf) GPS outputs from the GPS emulator splitter. In an embodiment, two or more turrets receive emulated rf GPS values and can successfully fly in the lab. The system further can include a time synchronization server and a SATCOM GPS receiver.

Figure 5:
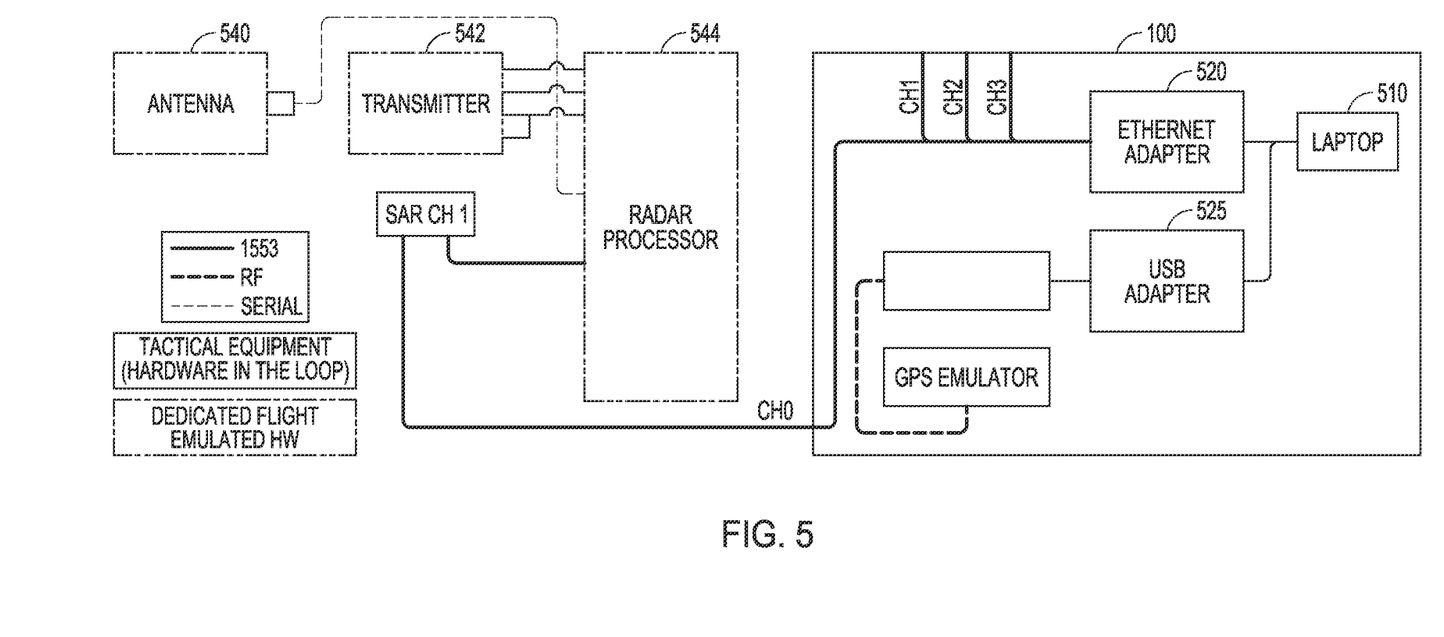
FIG. 5 is a block diagram of an example embodiment of a single system, minimal end user hardware in the loop navigational processing core (NPC).

FIG. 5 is a block diagram of an example embodiment of a single system, minimal end user hardware in the loop navigational processing core (NPC) 100. In this embodiment, the NPC 100 includes a laptop 510, an ethernet adapter 520 and a USB adapter 525, and a receiver 530. The hardware that is not in the loop includes an antenna 540, a transmitter 542, and an integrated radar transmitter 544. The embodiment of FIG. 5 minimizes the amount of user hardware required for operation. Rather than receiving GPS data from tactical hardware, a GPS receiver is provided with the emulation product. The NPC 100 runs on laptop provided with the emulation product. The number of channels emulated is only limited by number of bus adapters attached to the emulation product.

Figure 6A:
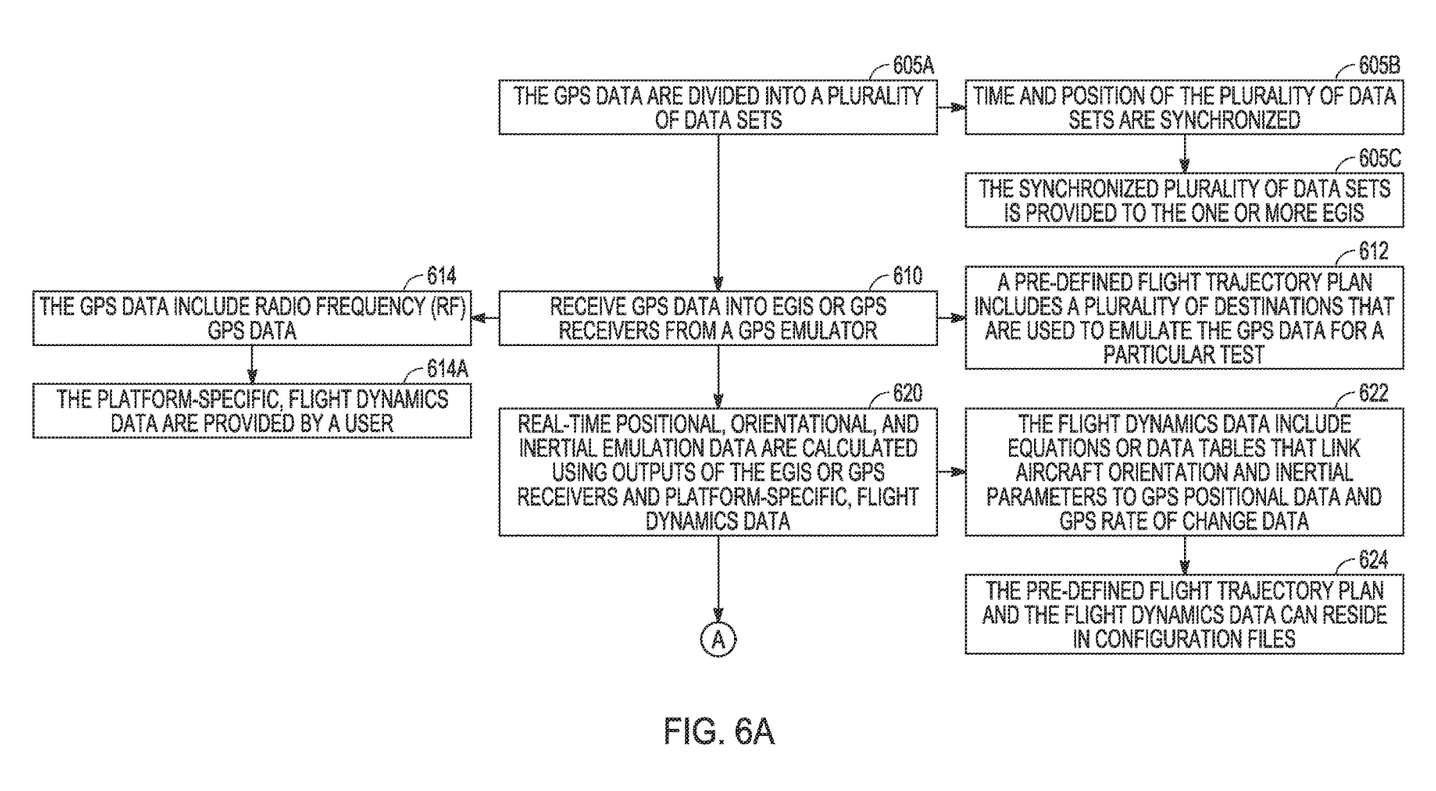
FIGS. 6A and 6B are a block diagram of an example embodiment of a process for emulating a concurrent, multi-sensor, multi-inertial navigation system.
Figure 6B:
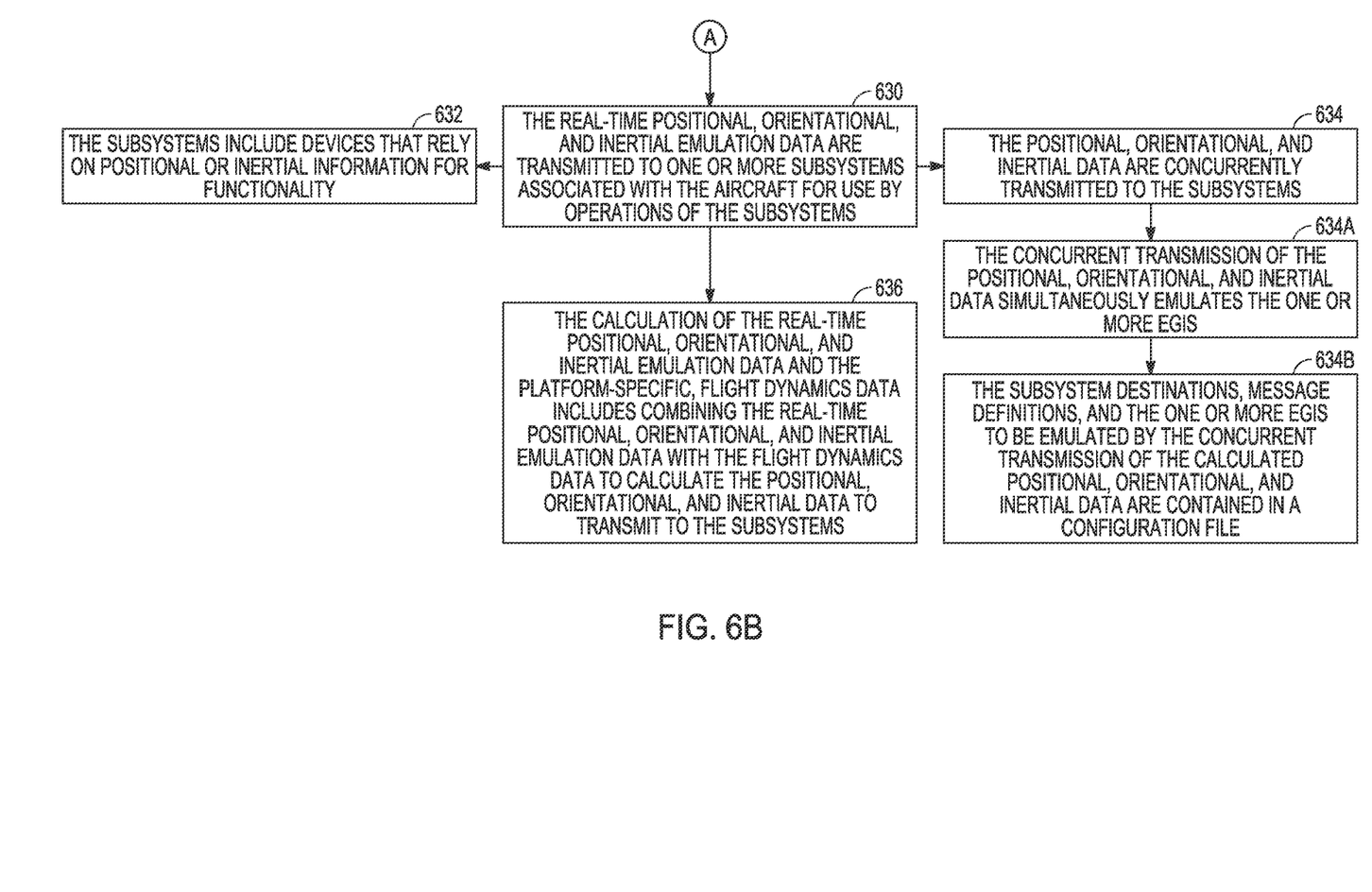

FIGS. 6A and 6B are a block diagram of an example embodiment of operations and features for emulating a concurrent, multi-sensor, multi-inertial navigation system.

FIGS. 6A and 6B include operation or feature blocks 610-636. Though arranged substantially serially in the example of FIGS. 6A and 6B, other examples may reorder the blocks, omit one or more blocks, and/or execute two or more blocks in parallel using multiple processors or a single processor organized as two or more virtual machines or sub-processors. Moreover, still other examples can implement the blocks as one or more specific interconnected hardware or integrated circuit modules with related control and data signals communicated between and through the modules. Thus, any process flow is applicable to software, firmware, hardware, and hybrid implementations.

Referring now specifically to FIGS. 6A and 6B, at 610, global positioning system (GPS) data are received into one or more EGIs (embedded GPS/inertial navigation system (INS)) or GPS receivers from a GPS emulator. The GPS data are based on a pre-defined flight trajectory plan of an aircraft. The pre-defined flight trajectory plan includes a plurality of destinations comprising latitude, longitude, altitude, and speed that are used to emulate the GPS data for a particular test (612). In an embodiment, as indicated at 614, the GPS data include radio frequency (rf) GPS data, and as indicated at 614A, the platform-specific, flight dynamics data are provided by a user.

At 620, real-time positional, orientational, and inertial emulation data are calculated using outputs of the EGIs or GPS receivers and platform-specific, flight dynamics data. The flight dynamics data comprise equations or data tables that link aircraft orientation and inertial parameters to GPS positional data and GPS rate of change data (622). The pre-defined flight trajectory plan and the flight dynamics data can reside in configuration files (624). At 630, the real-time positional, orientational, and inertial emulation data are transmitted to one or more subsystems associated with the aircraft for use by operations of the one or more subsystems. The one or more subsystems include devices that rely on positional or inertial information for functionality (632). In an embodiment, the positional, orientational, and inertial emulation data are concurrently transmitted to the one or more subsystems (634). At 634A, the concurrent transmission of the positional, orientational, and inertial emulation data simultaneously emulates the one or more EGIs. The subsystem destinations, message definitions, and the one or more EGIs to be emulated by the concurrent transmission of the calculated positional, orientational, and inertial emulation data are contained in a configuration file (634B). In an embodiment as indicated at 636, the calculation of the real-time positional, orientational, and inertial emulation data using the outputs of the one or more EGIs or GPS receivers and the platform-specific, flight dynamics data includes combining the real-time positional, orientational, and inertial emulation data with the flight dynamics data to calculate the positional, orientational, and inertial emulation data to transmit to the one or more subsystems At 605A, the GPS data are divided into a plurality of data sets. At 605B, time and position of the plurality of data sets are synchronized. At 605O, the synchronized plurality of data sets is provided to the one or more EGIs.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document, for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. A process comprising:
receiving global positioning system (GPS) data from a GPS emulator into one or more EGIs (embedded GPS/inertial navigation system (INS)) or GPS receivers, the GPS data based on a pre-defined flight trajectory plan of an aircraft;
calculating real-time positional, orientational, and inertial emulation data using outputs of the EGIs or GPS receivers and platform-specific, flight dynamics data; and
transmitting, based on subsystem destinations and message definitions contained in a configuration file, the real-time positional, orientational, and inertial emulation data to two or more subsystems associated with the aircraft for use by operations of the two or more subsystems.

2. The process of claim 1, comprising:
dividing the GPS data into a plurality of data sets;
synchronizing time and position of the plurality of data sets; and
providing the synchronized plurality of data sets to the one or more EGIs.

3. The process of claim 1, wherein the pre-defined flight trajectory plan includes a plurality of destinations comprising latitude, longitude, altitude, and speed that are used to emulate the GPS data for a particular test.

4. The process of claim 1, wherein the pre-defined flight trajectory plan and the flight dynamics data reside in configuration files.

5. The process of claim 1, wherein the flight dynamics data comprise equations or data tables that link aircraft orientation and inertial parameters to GPS positional data and GPS rate of change data.

6. The process of claim 1, wherein the two or more subsystems comprise devices that rely on positional or inertial information for functionality.

7. The process of claim 1, comprising concurrently transmitting the real-time positional, orientational, and inertial emulation data to the two or more subsystems.

8. The process of claim 7, wherein the concurrent transmission of the real-time positional, orientational, and inertial emulation data simultaneously emulates the one or more EGIs.

9. The process of claim 1, wherein the calculation of the real-time positional, orientational, and inertial emulation data using the outputs of the one or more EGIs or GPS receivers and the platform-specific, flight dynamics data comprises combining the real-time positional, orientational, and inertial emulation data with the flight dynamics data to calculate the positional, orientational, and inertial emulation data to transmit to the two or more subsystems.

10. The process of claim 1, wherein the GPS data comprise radio frequency (rf) GPS data; and wherein the platform-specific, flight dynamics data are provided by a user.

11. A non-transitory computer-readable medium comprising instructions that when executed by a processor execute a process comprising:
receiving global positioning system (GPS) data from a GPS emulator into one or more EGIs (embedded GPS/inertial navigation system (INS)) or GPS receivers, the GPS data based on a pre-defined flight trajectory plan of an aircraft;
calculating real-time positional, orientational, and inertial emulation data using outputs of the EGIs or GPS receivers and platform-specific, flight dynamics data; and
transmitting, based on subsystem destinations and message definitions contained in a configuration file, the real-time positional, orientational, and inertial emulation data to two or more subsystems associated with the aircraft for use by operations of the two or more subsystems.

12. The non-transitory computer-readable medium of claim 11, comprising instructions for:
dividing the GPS data into a plurality of data sets;
synchronizing time and position of the plurality of data sets; and
providing the synchronized plurality of data sets to the two or more EGIs.

13. The non-transitory computer-readable medium of claim 11, wherein the pre-defined flight trajectory plan includes a plurality of destinations comprising latitude, longitude, altitude, and speed that are used to emulate the GPS data for a particular test.

14. The non-transitory computer-readable medium of claim 11, wherein the flight dynamics data comprise equations or data tables that link aircraft orientation and inertial parameters to GPS positional data and GPS rate of change data.

15. The non-transitory computer-readable medium of claim 11, wherein the two or more subsystems comprise devices that rely on positional or inertial information for functionality.

16. The non-transitory computer-readable medium of claim 11, comprising instructions for concurrently transmitting the real-time positional, orientational, and inertial emulation data to the two or more subsystems;
wherein the concurrent transmission of the real-time positional, orientational, and inertial emulation data simultaneously emulates the one or more EGIs.

17. The non-transitory computer-readable medium of claim 11, wherein the calculation of the real-time positional, orientational, and inertial emulation data using the outputs of the one or more EGIs or GPS receivers and the platform-specific, flight dynamics data comprises combining the real-time positional, orientational, and inertial emulation data with the flight dynamics data to calculate the positional, orientational, and inertial emulation data to transmit to the two or more subsystems.

18. The non-transitory computer-readable medium of claim 11, wherein the GPS data comprise radio frequency (rf) GPS data; and wherein the platform-specific, flight dynamics data are provided by a user.

19. A system comprising:
a computer processor; and
a memory coupled to the computer processor;
wherein the computer processor and computer memory are operable for:
receiving global positioning system (GPS) data from a GPS emulator into one or more EGIs (embedded GPS/inertial navigation system (INS)) or GPS receivers, the GPS data based on a pre-defined flight trajectory plan of an aircraft;
calculating real-time positional, orientational, and inertial emulation data using outputs of the EGIs or GPS receivers and platform-specific, flight dynamics data; and
transmitting, based on subsystem destinations and message definitions contained in a configuration file, the real-time positional, orientational, and inertial emulation data to two or more subsystems associated with the aircraft for use by operations of the two or more subsystems.

* * * * *